United States Patent [19]
Keldsen et al.

[11] Patent Number: 6,007,347
[45] Date of Patent: Dec. 28, 1999

[54] COAXIAL CABLE TO MICROSTRIP CONNECTION AND METHOD

[75] Inventors: Dennis Keldsen, Aloha; Jim L. Martin; Laudie J. Doubrava, both of Tigard, all of Oreg.

[73] Assignee: Tektronix, Inc., Wilsonville, Oreg.

[21] Appl. No.: 09/082,080

[22] Filed: May 20, 1998

[51] Int. Cl.[6] ..................................... H01R 9/09
[52] U.S. Cl. ............................. 439/63; 439/581
[58] Field of Search .................. 439/63, 74, 581

[56] References Cited

U.S. PATENT DOCUMENTS

| | | |
|---|---|---|
| 4,602,831 | 7/1986 | Lockard . |
| 4,656,441 | 4/1987 | Takahashi et al. . |
| 4,901,041 | 2/1990 | Pengelly . |
| 4,906,957 | 3/1990 | Miller et al. . |
| 4,994,771 | 2/1991 | Takamine et al. . |
| 4,995,815 | 2/1991 | Buchanan et al. . |
| 5,120,258 | 6/1992 | Carlton . |
| 5,478,258 | 12/1995 | Wang ........................... 439/63 |
| 5,532,659 | 7/1996 | Dodart . |

*Primary Examiner*—Steven L. Stephan
*Assistant Examiner*—J. F. Duverne
*Attorney, Agent, or Firm*—Bennet K. Langlotz; Thomas F. Lenihan

[57] ABSTRACT

A coaxial cable 24 has an outer conductor 74 surrounding an inner conductor 70. A portion 76 of the inner conductor 70 is stripped of insulation and extends beyond the end of the outer conductor at a cable end 30. A circuit board 12 has a major surface and defines an elongated slot 34. A connection end of the slot is defined by a stop portion of the board 36, and a conductive pad 60 is provided on the board surface adjacent the stop portion at the end of the slot. The stripped portion 76 of inner conductor 70 is connected to the conductive pad 60, and at least a portion of the outer conductor 74 is received in the slot, and may be connected to another contact on the board. The stop portion of the slot is defined as a peninsular connection tab 54 by an elongated hole 50 formed on each side of said stop portion 36 of said slot. The distance between the sides of the conductive pad 60 and the near edges of the elongated holes 50 is selected to provide a predetermined transition impedance.

13 Claims, 4 Drawing Sheets

6,007,347

1

COAXIAL CABLE TO MICROSTRIP CONNECTION AND METHOD

FIELD OF THE INVENTION

The invention relates to electrical interconnections, and more particularly to interconnections for high frequency signals requiring impedance control.

BACKGROUND OF THE INVENTION

High frequency electronic instruments such as oscilloscopes and logic analyzers require controlled impedance conductors for carrying high frequency signals without distortion or degradation. Controlled impedance coaxial cables provide connection to external interconnects to which external circuits may be connected. Microstrip transmission lines on printed circuit boards (PCB) provide controlled impedance by placing signal lines in a layer overlaying a return line or layer.

Creating a junction between coaxial cables and a printed circuit board has provided a well known challenge. Even when the impedance of a cable and the microstrip line to which it is attached are well matched, the junction itself will tend to present a different transition impedance. Such impedance variations tend to generate reflection of pulses, which degrades performance, particularly at the increasingly higher frequencies required in many applications. Using time domain reflectometery analytic tools, the limitations of existing cable-to-board interconnects become apparent.

A typical interconnect adequate for lower frequency usage employs a block to which the cable is connected. The block has multiple pins for soldering to PCB through-holes, with the outer shielding conductor (return line) of the cable connected to the block, and the inner conductor (signal line) connected directly to a through hole in the board. The inherent spacing between the through hole for the signal line and the holes for the return line will generally have a different impedance than desired, rendering this type of interconnect unsuitable for critical applications.

For critical applications, various interconnects have provided adequate performance, but at very high cost, or with other disadvantages. Such interconnects may require substantial time and skill for proper installation, and may be complex parts with a high manufacturing cost. Some interconnects may be precise, but of delicate construction that allows the characteristics to vary undesirably in response to mechanical forces and stresses. Other interconnect designs may require custom "trimming" in which a skilled worker tunes the characteristics of each interconnect to the desired characteristics.

SUMMARY OF THE INVENTION

The embodiments disclosed herein overcome these limitations by providing a coaxial cable having an outer conductor surrounding an inner conductor. A free end portion of the inner conductor extends beyond the end of the outer conductor at a cable end. A circuit board has a major surface and defines an elongated slot. A connection end of the slot is defined by a stop portion of the board, and a conductive pad is provided on the board surface adjacent the stop portion at the end of the slot. The inner conductor is connected to the conductive pad, and at least a portion of the outer conductor is received in the slot, and may be connected to another contact on the board. The stop portion of the slot is defined as a peninsular tab by an elongated hole formed on each side of said stop portion of said slot. The distance

2 between the sides of the conductive pad and the near edges of the elongated holes is selected to provide a predetermined transition impedance.

DETAILED DESCRIPTION OF A PREFERRED EMBODIMENT

Figure 1:
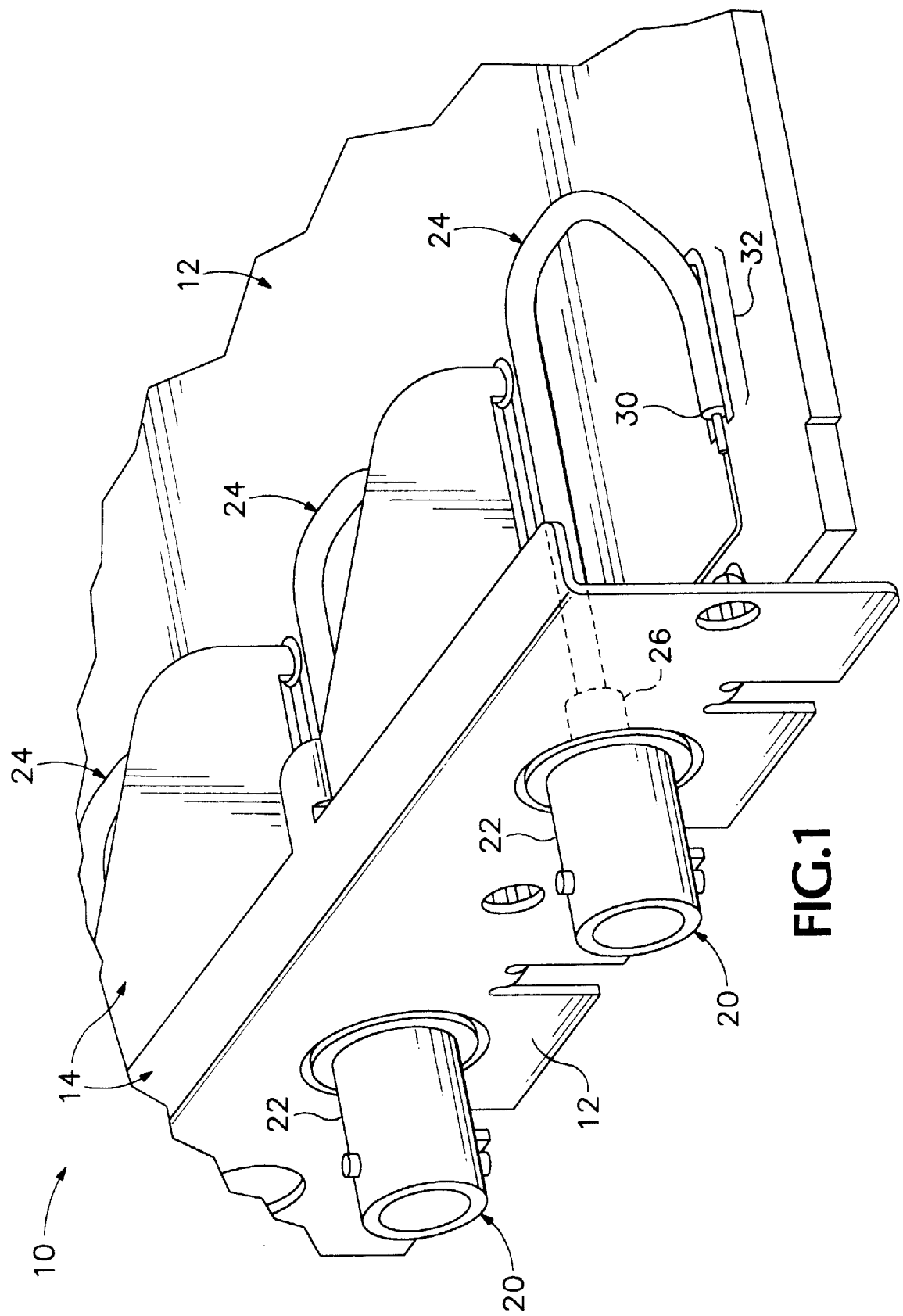
FIG. 1 is a perspective view of a portion of an instrument having an interconnect according to a preferred embodiment of the invention.

FIG. 1 shows an electronic instrument 10 having a printed circuit board (PCB) 12, with a connector frame 14 mechanically mounted at an edge of the board. The frame includes a chassis panel 16 oriented perpendicular to the plane of the board. Several BNC connectors 20 are mounted to the chassis panel, with connection portions 22 extending from the chassis away from the board 12 for connection to other instruments, circuitry or components via conventional BNC cables (not shown). In alternative embodiments, any type of coax cable connector may be used, and the invention may be employed in conjunction with coax cables not terminated at a connector, but terminated by a direct connection to another instrument, component, or other electrical element, including by a connection according to the invention. An interior portion (not shown) of each connector 20 extends toward the board, into the interior of the instrument.

A semi rigid coaxial cable 24 is associated with each BNC connector 20, with a first end 26 connected to the connector 20, and a second end 30 connected to the board. The cable has a metal outer conductor surrounding an insulating sleeve that surrounds a metal inner conductor, as will be discussed in greater detail below. The second cable end 30 is connected to a slot-and-pad connection element 32 on the board.

Figure 2:
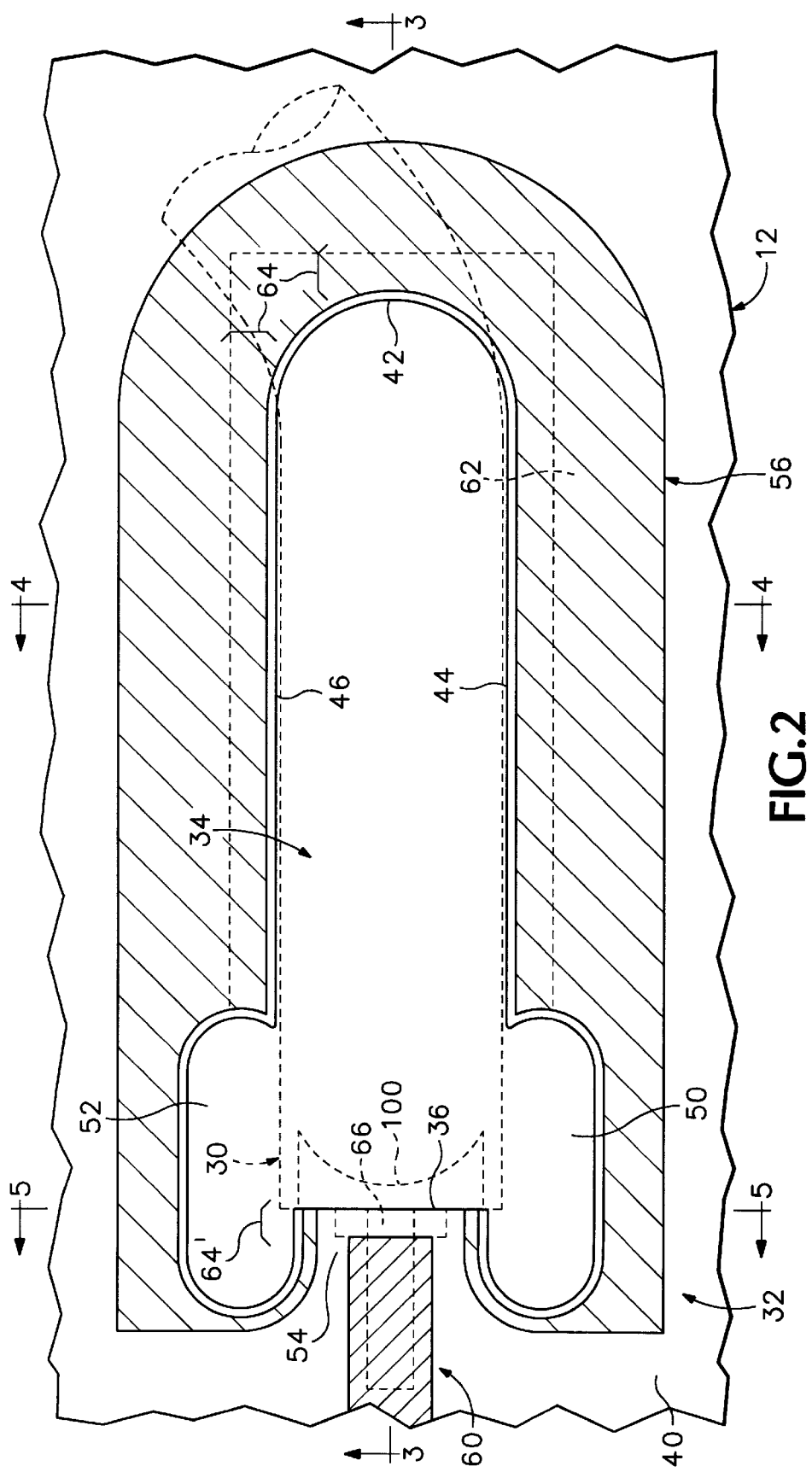
FIG. 2 is an enlarged plan view of a printed circuit board of the embodiment of FIG. 1.

FIG. 2 shows a board portion on which the connection 32 is formed. The connection element 32 includes an elongated slot 34 having a flat first end defined by a stop surface 36 perpendicular to the axis of the slot and to the major surface 40 of the board. A second end 42 of the slot is radiused to provide a diameter equal to the width of the slot. The radius of the second end is not a critical shape, but is employed only because of the inherent shape formed by a drill bit used to form the slot. Nor is the length of the slot critical, except in that it provides adequate length for a cable portion to rest. In alternative embodiments, the slot may be positioned to open to a board edge instead of being terminated at the rounded end, so that a cable may enter the slot from the edge or from below the slot.

The slot is defined by opposed parallel straight sides 44, 46 that extend from the second end 42 about three-quarters of the way to the first end. On opposite sides of the first end, oblong pockets 50, 52, are aligned with the slot, and extend beyond the stop surface to define sides of a peninsular connection tab 54. The oblong pockets extend laterally beyond the sides 44, 46 of the slot to effectively provide a widened portion of the slot. The purpose of the pockets is to allow a router bit to machine a straight edge on the stop surface, allowing close contact between the cable and the stop surface, as will be detailed below.

In terms of PCB manufacturing, the slot is essentially a plated through hole, with the exception of the unplated stop surface 36. A slot land 56 provides a conductive margin around the periphery of the slot, except at the stop surface 36. A similar land is provided at the lower surface of the board. An elongated rectangular contact pad 60 is positioned in line with the slot axis at the first end of the slot, beginning within a small margin 64 ' from the stop surface 36, and extending away from the slot to function as a terminal of a microstrip line. The width of the pad is limited to maintain adequate spacing from the plating lands at the medial portions of the oblong pockets 50, 52.

A ground plane 62 is provided by a conductive sheet sandwiched at an intermediate level within the board. The sheet largely extends across the entire board, except that it is spaced away from the through hole plating at the sides 44, 46 and first end 42 of the slot by a margin 64. This reduces thermal sinking affecting soldering of the cable's outer conductor to the slot without disrupting the electrical impedance, as will be discussed below. The ground plane is also spaced away from the stop surface 36 to provide a setback space 66 slightly wider than the width of the contact pad 60, and spaced from the stop surface by the same distance as is the pad. Where the ground plane is absent, a nonconductive adhesive fills the setback space 66 and margins 64.

Figure 3:
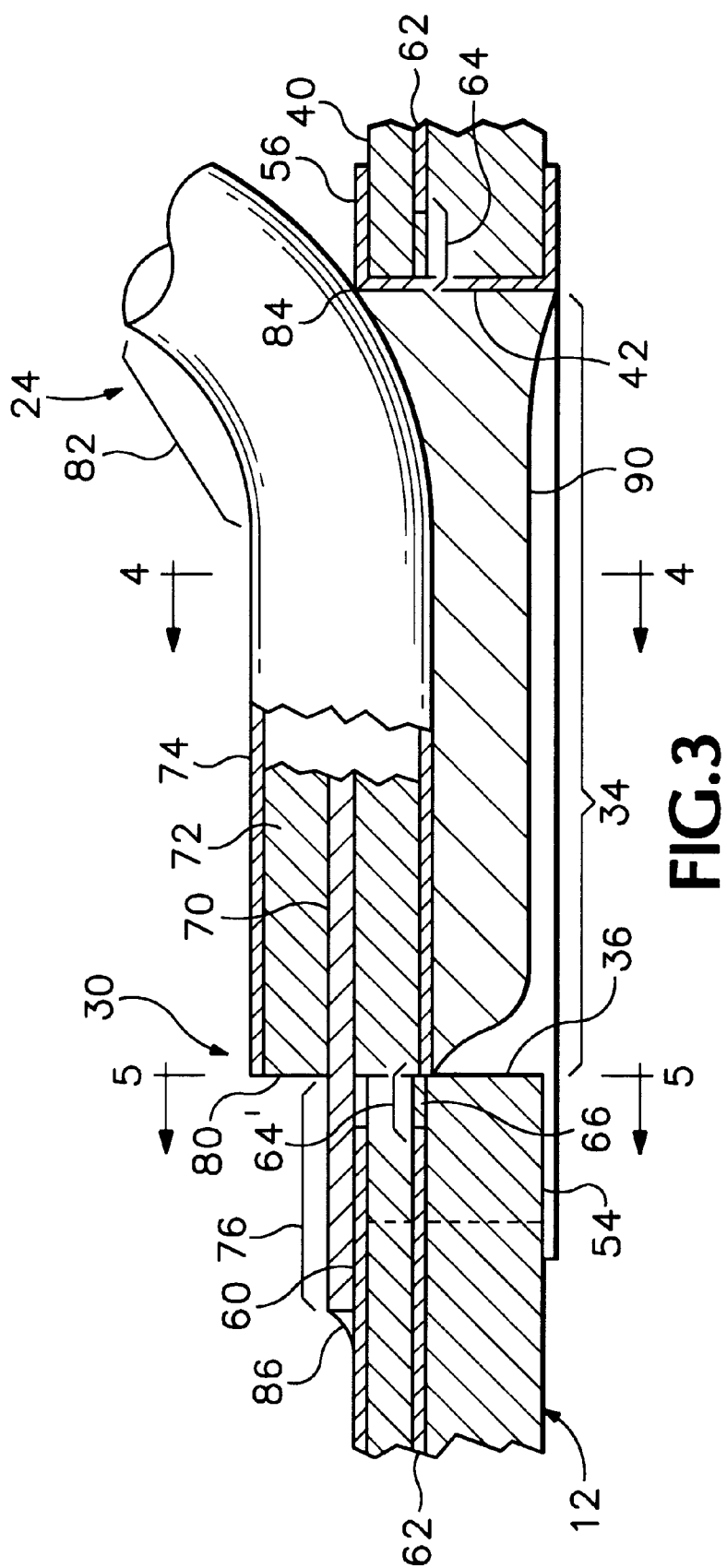
FIG. 3 is an enlarged sectional side view of the interconnect of FIG. 1 taken along line 3—3 of FIG. 2.

As shown in FIG. 3, the end 30 of the cable is received in slot 34. The cable has an inner conductor 70 surrounded by an insulator layer 72, which is surrounded by an outer conductor 74. A free end portion 76 of the inner conductor 70 is stripped of insulation and extends beyond the outer conductor and insulator, which terminate at a shoulder 80. The shoulder abuts the stop surface 36, and the inner conductor free end 76 rests on the contact pad 60, and is soldered for an electrical and mechanical connection. Except near the curved end 42 of the slot, where the cable is curved to pass upward and beyond the slot, the cable end portion is parallel to the upper surface 40 of the board 12. Over this portion, with the lower surface of the inner conductor resting atop the upper surface at the contact pad 60, slightly less than half of the cable diameter extends below the upper surface. As discussed above, the slot may be open to the edge or the board, omitting the rounded end, so that the cable may continue level beyond the board edge. The distance by which the cable extends below the surface is approximately equal to the sum of the radial wall thickness of the insulator and the outer conductor.

Figure 4:
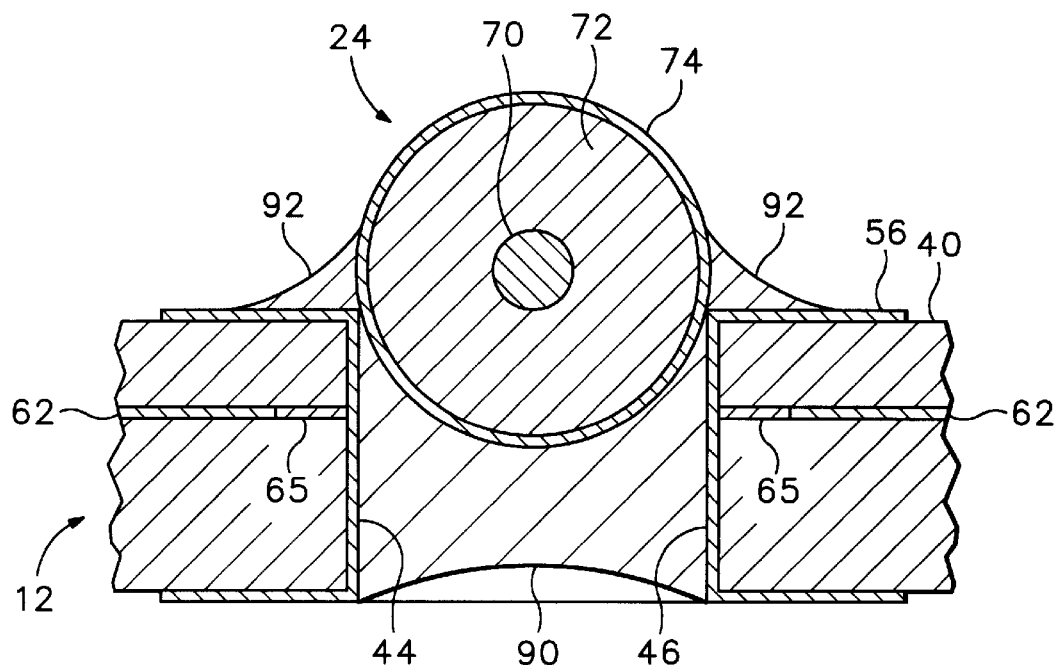
FIG. 4 is a sectional view of the interconnect of FIG. 1 taken along line 4—4 of FIG. 3.

As shown in FIG. 4, the width of the slot is sized to fit the outside diameter of the cable, so that the inner conductor's free end 76 may rest directly on contact pad 60. While the slot may be slightly narrower than the cable exterior and still allow the free end to make contact and limit the vertical position of the cable end, for ease of manufacturing and to allow for typical dimensional variations, it is preferable to allow the cable to vertically float in the slot, limited vertically by the free end, and by the cable body at the rounded slot end 42. Referring back to FIG. 3, the end of the cable residing in the slot is provided with a bend 82 that raises a lower surface point 84 spaced apart from the shoulder 80 by the length of the slot to a level in line with the lower surface of the free end 76. Thus, the remaining portion of the cable end in the slot is straight and level.

Figure 5:
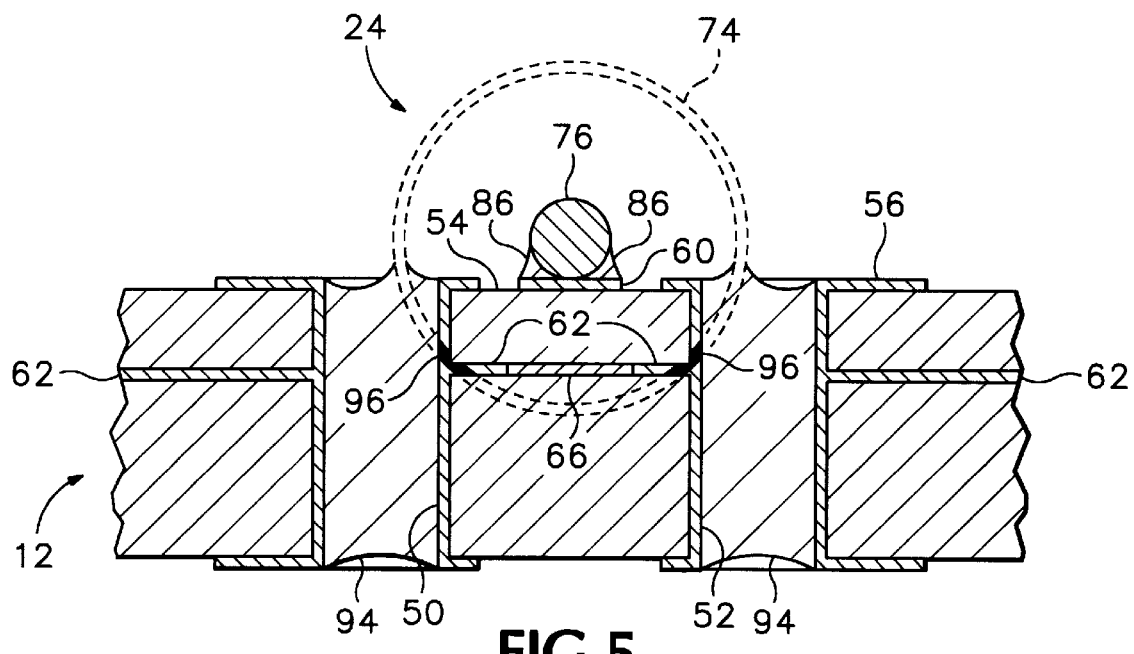
FIG. 5 is a sectional view of the interconnect of FIG. 1 taken along line 5—5 of FIG. 3.

The cable is soldered in place to provide connections to both conductors, and for mechanical stability. As shown in FIGS. 3 and 5, the inner conductor free end 76 is connected by way of solder joint 86 to the contact pad 60. As shown in FIGS. 3 and 4, a main solder joint 90 largely fills the slot beneath the cable. FIG. 4 shows upper solder fillets 92, which connect the outer conductor 74 to the slot land.

When the pockets are properly filled with solder, a minimal-length solder connection is formed between the outer conductor of the coax cable and the through hole plating 65 at the medial portions of the pockets, which connect directly to the ground plane beneath the contact pad 60. Solder will also wick between the shoulder of the outer conductor and the edge of the ground plane 62 exposed at the stop surface 36 at contact zones 96 illustrated with dark hatching in FIG. 5.

Another important feature in the electrical design of the interconnect is the transition impedance control afforded by adjustments in width of the connection tab 54 and of the contact pad 60. Either width dimension may be varied during the design phase to set the correct transition impedance. The distance between the sides of contact pad 60 and the near edge of the adjacent elongated hole 50,52 which defines connection tab 54 affects the transition impedance and may be adjusted by changing the width of contact pad 60, by changing the center to center dimension of the elongated holes (i.e., oblong pockets) 50, 52, or by maintaining the center to center dimension of the elongated holes 50, 52, and changing the width of elongated holes 50, 52. This adjustment feature allows the interconnect to be optimized for a wide range of coaxial cable impedances, inner & outer diameters, and can accommodate a wide range of PCB board thicknesses, materials and construction/layup (number of layers, layer thickness etc.) A two-dimensional fields analysis program such as ELECTRO is used in setting the tab and contact dimensions for a given set of coaxial and PCB properties.

In the preferred embodiment, the slot has a length of 0.328 (all dimensions in inches), a width of 0.087, and a depth extending to the board's full thickness of 0.094. At the pockets, the slot has a width of 0.041, with the pockets having a length of 0.110. The peninsular connection tab 54 has a length of 0.037, and a width of 0.070. The land 56 has a width of 0.050 along the main portion of the slot. The contact pad 60 has a length of 0.070, a width of 0.030, and is spaced apart from the stop face 36 by about 0.010. The ground plane margins 64 are about 0.015 wide. The board 12 is typically an eight-layer board in the preferred embodiment. The cable is a semi rigid type such as UT85-LL from Micro-Coax of Collegeville, Pa., with an inner conductor diameter of 0.0226, an insulator diameter of 0.066, and an outside diameter of 0.0865.

The preferred embodiment is constructed by first preparing the circuit board. The ground plane and other inner layers are etched, and the layers of the board laminated together, according to conventional manufacturing processes. The board is then drilled and the slots and pockets machined by using a slot drilling process. All holes in the PCB are then through-hole plated. At this stage, the slot has a radius at both ends. At the contact pad end, the slot intersects with the pockets, but has a curved end 100 spaced apart from the eventual stop face 36 by a margin, as shown in dashed lines in FIG. 2. Thus, the entire slot and pocket aperture may be fully plated as a through hole, with a surrounding land encompassing the entire aperture. When the PCB is nearly finished, the curved end 100 is routed away to form the stop end 36, so that there is no plating on the stop end, and so that there is no plated land along the upper surface edge of the stop end. The extra width provided by the pockets provides the runout space for a round router bit to pass beyond the corners of the stop end 36 for a fully flat surface, without contacting the lateral plated surfaces of the pockets.

Assembly proceeds with cutting cable sections to length, stripping the first end for connection to a connector, and stripping the second end to expose the free end. The cable is bent to the desired shape, which it retains due to its semi rigid characteristics. The first end is electrically and mechanically connected to the connector 20. Thus connected the pre-bent cable naturally rests the free end in the slot. Preferably, the cable is bent to slightly bias the shoulder against the slot end, and to bias the body downward against the slot, to eliminate the need of fixturing for soldering. The connection is completed by soldering the inner conductor to the contact pad, and connecting the outer conductor by filling the oblong pockets with solder. Additional mechanical strength is provided by soldering along the slot on each lateral side of the coax cable.

While the disclosure is made in terms of a preferred embodiment, the invention is not intended to be so limited.

We claim:

1. A coaxial cable and circuit board apparatus, comprising:
   a coaxial cable having an outer conductor surrounding an inner conductor, said inner conductor having a free end portion stripped of insulation and extending beyond the end of the outer conductor at a terminus of the cable;
   a circuit board having a length dimension, a width dimension, and a depth dimension, said length and width dimensions forming a major surface area and said major surface area defining a slot;
   a connection end of the slot defined by a stop surface of the board, said stop surface of said slot being defined as a peninsular connection tab having a width determined by placement and size of an elongated hole formed on each side of said stop portion of said slot, a perimeter of said elongated holes being through-hole plated;
   a conductive pad formed on the peninsular connection tab adjacent the stop surface of the board, said conductive pad having an end and first and second sides;
   the inner conductor being directly connected to the conductive pad; and
   at least a portion of the outer conductor being received in the slot;
   wherein the width of the peninsular connection tab affects a distance between one of said first and second sides of said conductive pad and a near edge of one of said elongated holes said distance determining a transition impedance of said apparatus.

2. The apparatus of claim 1 wherein the slot is at least in part a plated through hole having a conductive surface extending perpendicular to the major surface of the board.

3. The apparatus of claim 1 wherein the outer conductor is soldered to the slot.

4. The apparatus of claim 1 wherein the outer conductor abuts the stop portion.

5. The apparatus of claim 1 wherein the stop portion includes a stop surface perpendicular to a major axis of the slot and perpendicular to the major surface.

6. The apparatus of claim 1 wherein the board includes a conductive layer spaced apart from the major surface, and wherein the conductive layer is connected to the outer conductor of the cable.

7. The apparatus of claim 6 wherein the conductive layer includes an edge portion exposed at the stop portion of the board.

8. An electronic instrument comprising:
   a circuit board having a length dimension, a width dimension, and a depth dimension, said length and width dimensions forming a major surface area and said major surface area defining a slot;
   a frame member connected to the circuit board;
   an interconnect connected to the frame member;
   a coaxial cable having an outer conductor surrounding an inner conductor, having a first end connected to the interconnect, and the inner conductor having a second end at which a free end portion of the inner conductor is stripped of insulation and extends beyond the outer conductor;
   a connection end of the slot defined by a stop surface of the board, said stop surface of said slot being defined as a peninsular connection tab having a width determined by placement and width of an elongated hole formed on each side of said stop portion of said slot, a perimeter of said elongated holes being through-hole plated;
   a conductive pad formed on the peninsular connection tab adjacent the slot, said conductive pad having an end and first and second sides;
   the inner conductor being directly connected to the conductive pad;
   the outer conductor being connected to a second conductive element on the board; and
   at least a portion of the outer conductor being received in the hole;
   wherein the width of the peninsular connection tab affects a distance between one of said first and second sides of said conductive pad and a near edge of one of said elongated holes said distance determining a transition impedance of said apparatus.

9. The apparatus of claim 8 wherein the slot is at least in part a plated through hole having a conductive surface extending perpendicular to the major surface of the board.

10. The apparatus of claim 8 wherein the outer conductor is soldered to the hole.

11. The apparatus of claim 8 wherein the outer conductor has an end portion oriented parallel to the major surface of the board.

12. The apparatus of claim 8 wherein the outer conductor abuts the stop portion.

13. The apparatus of claim 8 wherein the board includes a conductive layer spaced apart from the major surface, and wherein the conductive layer is connected to the outer conductor of the cable.

* * * * *